US008212030B2

(12) United States Patent
Jeong et al.

(10) Patent No.: US 8,212,030 B2
(45) Date of Patent: Jul. 3, 2012

(54) COMPOSITION FOR PRODUCING INSULATOR AND ORGANIC INSULATOR USING THE SAME

(75) Inventors: Eun Jeong Jeong, Seongnam-si (KR); Jong Baek Seon, Seoul (KR); Joo Young Kim, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1084 days.

(21) Appl. No.: 12/149,211

(22) Filed: Apr. 29, 2008

(65) Prior Publication Data

US 2009/0189149 A1 Jul. 30, 2009

(30) Foreign Application Priority Data

Jan. 25, 2008 (KR) .................. 10-2008-0008224

(51) Int. Cl.
*C07D 251/10* (2006.01)
*H01L 21/31* (2006.01)
(52) U.S. Cl. ........... 544/180; 438/780; 257/40; 556/450
(58) Field of Classification Search .................. 544/180; 556/450; 438/780; 257/40
See application file for complete search history.

(56) References Cited

U.S. PATENT DOCUMENTS

| 5,347,114 | A | 9/1994 | Tanaka |
| 5,946,551 | A | 8/1999 | Dimitrakopoulos et al. |
| 5,981,970 | A | 11/1999 | Dimitrakopoulos et al. |
| 6,232,157 | B1 | 5/2001 | Dodabalapur et al. |
| 6,586,791 | B1 | 7/2003 | Lee et al. |
| 6,791,649 | B1 | 9/2004 | Nakamura et al. |
| 7,267,854 | B2 * | 9/2007 | Auerbach ............... 428/34 |
| 7,897,519 | B2 * | 3/2011 | Jeong et al. .............. 438/780 |
| 2003/0134222 | A1 | 7/2003 | Lee et al. |
| 2005/0170284 | A1 | 8/2005 | Lee et al. |
| 2007/0129473 | A1 | 6/2007 | Shin et al. |
| 2008/0027203 | A1 | 1/2008 | Dams |

OTHER PUBLICATIONS

Y.Y. Lin et al. "High Mobility Pentacene Organic Thin Film Transistors". Electronic Materials and Processing Research Laboratory, pp. 80-81. 54th Annual Device Research Conference Digest 1996.
Carmen Bartic et al. "$Ta_2O_5$ as gate dielectric material for low-voltage organic thin-film transistors". Organic Electronics 3, 65-72. 2002.
C. D. Dimitrakopoulos et al. "Low-Voltage Organic Transistors on Plastic Comprising High-Dielectric Constant Gate Insulators". Science vol. 283, pp. 822-824. Feb. 5, 1999.
Office Action for corresponding U.S. Appl. No. 11/808,463 dated Feb. 24, 2009.
Office Action for corresponding U.S. Appl. No. 11/808,463 dated Aug. 31, 2009.
Office Action for corresponding U.S. Appl. No. 11/808,463 dated Dec. 18, 2009.
Office Action for corresponding U.S. Appl. No. 11/808,463 dated May 25, 2010.

\* cited by examiner

*Primary Examiner* — Charanjit Aulakh
(74) *Attorney, Agent, or Firm* — Harness, Dickey & Pierce, P.L.C.

(57) ABSTRACT

Disclosed herein is a composition for producing an insulator. More specifically, the composition comprises a silane-based organic-inorganic hybrid material containing one or more multiple bonds, an acrylic organic crosslinking agent and a silane-based crosslinking agent having six or more alkoxy groups. Also disclosed herein is an organic insulator produced using the insulator composition. The organic insulator is highly crosslinked to facilitate the fabrication of an organic thin film transistor in terms of processing.

11 Claims, 2 Drawing Sheets

COMPOSITION FOR PRODUCING INSULATOR AND ORGANIC INSULATOR USING THE SAME

CROSS-REFERENCE TO RELATED APPLICATIONS

This non-provisional application claims priority under U.S.C. §119 to Korean Patent Application No. 2008-8224, filed on Jan. 25, 2008, the entire contents of which is incorporated herein in its entirety by reference.

BACKGROUND

1. Field of the Invention

This disclosure is directed to a composition for producing an insulator (hereinafter, referred to simply as an 'insulator composition') and an organic insulator produced using the insulator composition. More specifically, the insulator composition comprises a silane-based organic-inorganic hybrid material containing one or more multiple bonds, an acrylic organic crosslinking agent and a silane-based crosslinking agent having six or more alkoxy groups to exhibit improved processability when used to form an insulating film of a thin film transistor.

2. Description of the Related Art

Thin film transistors (TFTs) are currently used as switching devices to control the operation of individual pixels and driving devices of the pixels in flat panel displays, such as liquid crystal displays (LCDs) and electroluminescent displays (ELDs). Thin film transistors are also expected to be useful in plastic chips for smart cards and inventory tags.

A typical thin film transistor may be comprise a semiconductor layer having source and drain regions, both of which are doped with high-concentration impurities, and a channel region formed between the source and drain regions; a gate electrode insulated from the semiconductor layer and positioned in a region opposite to the channel region; and source and drain electrodes in contact with the source and drain regions, respectively.

Inorganic semiconductor materials, such as silicon (Si), have been commonly used as materials for semiconductor layers of thin film transistors. With an increasing demand for large-area, inexpensive and flexible displays, however, semiconductor layers may use organic semiconductor materials rather than inorganic semiconductor materials that incur considerable cost and require high-temperature vacuum processes. Under these circumstances, a number of studies on organic thin film transistors (OTFTs) using an organic film as a semiconductor layer may be now being undertaken.

A gate electrode may be disposed under an insulating film, and source/drain electrodes and a semiconductor layer may be formed on the insulating film to fabricate an organic thin film transistor. The insulating film should may be rigid and dense through crosslinking so as to withstand chemicals and may be stably maintained even under extreme processing conditions in the subsequent steps. Thus, an insulating film that may be highly crosslinked to facilitate the fabrication of an organic thin film transistor in terms of processing would be desirable.

SUMMARY

Disclosed herein is a composition for producing an insulator, which comprises a silane-based organic-inorganic hybrid material containing one or more multiple bonds, an acrylic organic crosslinking agent and a silane-based crosslinking agent having six or more alkoxy groups.

The insulator composition exhibits improved processability when used to form an insulating film due to its excellent crosslinkability.

The acrylic organic crosslinking agent may have a structure represented by Formula 1:

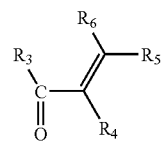

(1)

wherein $R_3$, $R_4$, $R_5$ and $R_6$ are independently a hydrogen atom, a hydroxyl group, a $C_1$-$C_{10}$ alkyl group, a $C_3$-$C_{10}$ cycloalkyl group, a $C_6$-$C_{15}$ aryl group, a $C_2$-$C_{30}$ acryl group, a $C_4$-$C_{30}$ alkyl group substituted with one or more acryl groups, a $C_2$-$C_{30}$ alkyl group substituted with one or more hydroxyl groups, a $C_2$-$C_{30}$ alkyl or cycloalkyl group containing one or more epoxy groups, a vinyl group, an allyl group, or a $C_1$-$C_{10}$ alkoxy group.

The silane-based crosslinking agent may have a structure selected from the group consisting of structures of Formula 3, 4 and 5:

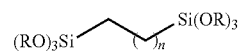

(3)

wherein each R is a $C_1$-$C_{10}$ alkyl group and n is from about 1 to about 10;

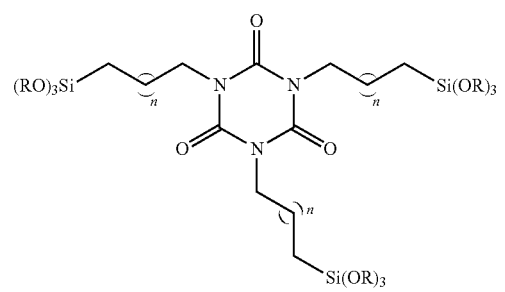

(4)

wherein R and n are as defined in Formula 3; and

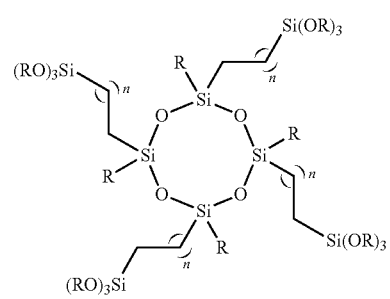

(5)

wherein R and n are as defined in Formula 3.

In an embodiment, the silane-based organic-inorganic hybrid material may be an organic silane compound of Formula 9 or 10:

$$R_1SiX_1X_2X_3 \quad (9)$$

wherein $R_1$ is a hydrogen atom, a $C_1$-$C_{10}$ alkyl group, a $C_3$-$C_{10}$ cycloalkyl group, a $C_6$-$C_{15}$ aryl group, a $C_2$-$C_{30}$ acryl group, a $C_4$-$C_{30}$ alkyl group substituted with one or more acryl groups, a $C_2$-$C_{30}$ alkyl or cycloalkyl group containing one or more epoxy groups, a vinyl group, an allyl group, or a $C_1$-$C_{10}$ alkoxy group, with the proviso that $R_1$ contains at least one group selected from vinyl, acetylene and acryl groups, and $X_1$, $X_2$ and $X_3$ are independently a halogen atom or a $C_1$-$C_{10}$ alkoxy group, with the proviso that at least one of $X_1$, $X_2$ and $X_3$ is a hydrolyzable group; or

$$R_1R_2SiX_1X_2 \quad (10)$$

wherein $R_1$ and $R_2$ are independently a hydrogen atom, a $C_1$-$C_{10}$ alkyl group, a $C_3$-$C_{10}$ cycloalkyl group, a $C_6$-$C_{15}$ aryl group, a $C_2$-$C_{30}$ acryl group, a $C_4$-$C_{30}$ alkyl group substituted with one or more acryl groups, a $C_2$-$C_{30}$ alkyl or cycloalkyl group containing one or more epoxy groups, a vinyl group, an allyl group, or a $C_1$-$C_{10}$ alkoxy group, with the proviso that at least one of $R_1$ and $R_2$ contains at least one group selected from vinyl, acetylene and acryl groups, and $X_1$ and $X_2$ are independently a halogen atom or a $C_1$-$C_{10}$ alkoxy group, with the proviso that at least one of $X_1$ and $X_2$ is a hydrolyzable group.

In an alternative embodiment, the silane-based organic-inorganic hybrid material may be a resin prepared by hydrolysis and condensation of at least one compound selected from the compounds of Formula 9 and 10 in the presence of an acid or base catalyst and water in an organic solvent.

In another alternative embodiment, the silane-based organic-inorganic hybrid material may be a resin prepared by hydrolysis and condensation of at least one compound selected from the compounds of Formula 9 and 10 with a compound of Formula 11:

$$SiX_1X_2X_3X_4 \quad (11)$$

wherein $X_1$, $X_2$, $X_3$ and $X_4$ are independently a halogen atom or a $C_1$-$C_{10}$ alkoxy group, with the proviso that at least one of $X_1$, $X_2$, $X_3$ and $X_4$ is a hydrolyzable group, in the presence of an acid or base catalyst and water in an organic solvent.

Disclosed herein too is an organic insulator comprising the organic insulator composition.

The organic insulator is highly crosslinked.

Disclosed herein too is an organic thin film transistor comprising a substrate, a gate electrode, an insulating layer, an organic semiconductor layer and source/drain electrodes wherein the insulating layer may be the organic insulator.

The organic thin film transistor may be advantageously fabricated with improved processability due to the use of the organic insulator.

Disclosed herein too is an electronic device using the organic thin film transistor.

BRIEF DESCRIPTION OF THE DRAWINGS

Example embodiments will be more clearly understood from the following detailed description taken in conjunction with the accompanying drawings, in which.

Figure 1:
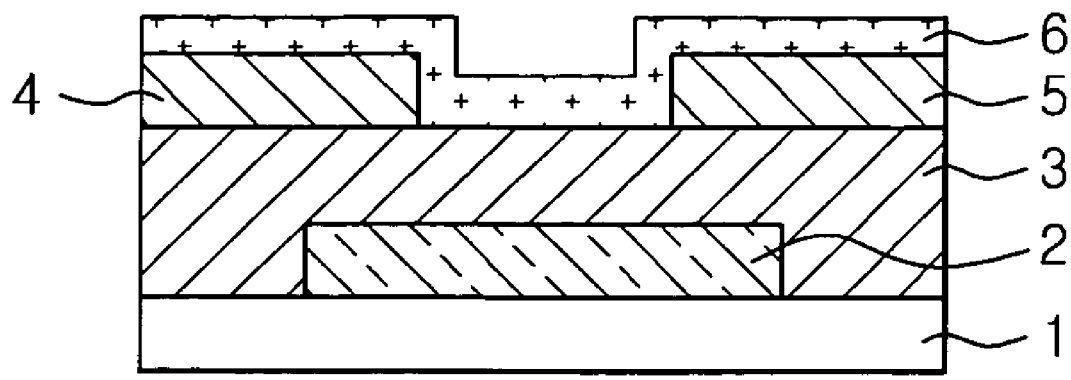
FIG. 1 is a schematic cross-sectional view of a bottom contact organic thin film transistor.

DESCRIPTION OF THE PREFERRED
EMBODIMENTS

Hereinafter, a detailed description will be given of example embodiments with reference to the accompanying drawings.

It will be understood that when an element or layer is referred to as being "on," "interposed," "disposed," or "between" another element or layer, it may be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to one embodiment, there may be provided a composition for producing an insulator, which comprises a silane-based organic-inorganic hybrid material containing one or more multiple bonds, an acrylic organic crosslinking agent and a silane-based crosslinking agent having six or more alkoxy groups.

Suitable acrylic organic crosslinking agents include, but are not necessarily limited to, compounds that is represented by Formula 1:

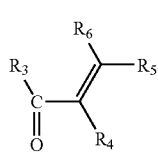

(1)

wherein $R_3$, $R_4$, $R_5$ and $R_6$ are independently a hydrogen atom, a hydroxyl group, a $C_1$-$C_{10}$ alkyl group, a $C_3$-$C_{10}$ cycloalkyl group, a $C_6$-$C_{15}$ aryl group, a $C_2$-$C_{30}$ acryl group, an alkyl group substituted with one or more acryl groups, an alkyl group substituted with one or more hydroxyl groups, an alkyl or cycloalkyl group containing one or more epoxy groups, a vinyl group, an allyl group, or a $C_1$-$C_{10}$ alkoxy group.

Examples of the acrylic organic crosslinking agent of Formula 1 include, but are not necessarily limited to, the following compounds 2:

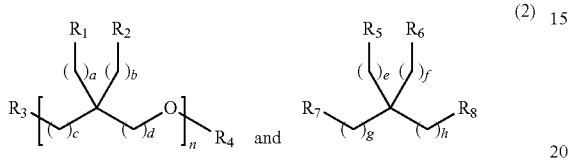

(2)

wherein $R_1$, $R_2$, $R_3$, $R_4$, $R_5$, $R_6$, $R_7$ and $R_8$ are independently a hydrogen atom, a hydroxyl group, a $C_1$-$C_{10}$ alkyl group, a $C_3$-$C_{10}$ cycloalkyl group, a $C_6$-$C_{15}$ aryl group, a $C_2$-$C_{30}$ alkyl or cycloalkyl group substituted with at least one group selected from acryloyl, acryloyloxy, epoxy and hydroxyl groups, a vinyl group, an allyl group, an acryloyloxy group, an epoxy group, or a $C_1$-$C_{10}$ alkoxy group, with the proviso that at least one of $R_1$ to $R_8$ contains an acryl group; a, b, c and d are zero or a natural number, the sum thereof being equal to or greater than 2; n is from about 1 to about 5, provided that when n is greater than 1, $R_1$ may not be identical to $R_2$; and e, f, g and h is zero or a natural number, the sum thereof being equal to or greater than 2.

Suitable silane-based crosslinking agents include, but are not necessarily limited to, compounds represented by Formula 3, 4 and 5:

(3)

wherein each R is a $C_1$-$C_{10}$ alkyl group and n is from about 1 to about 10;

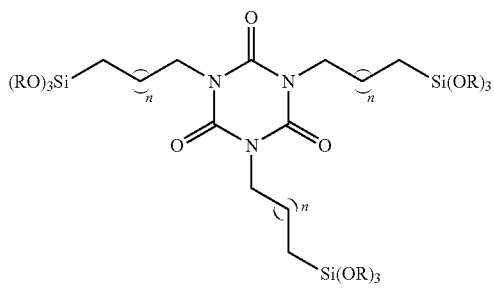

(4)

wherein R and n are as defined in Formula 3; and

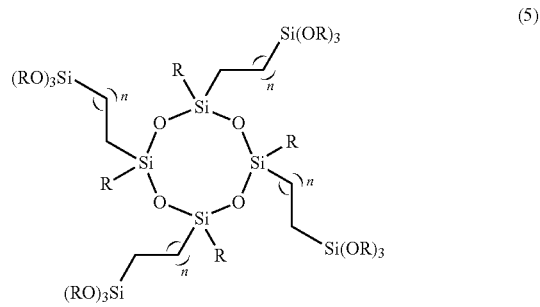

(5)

wherein R and n are as defined in Formula 3.

Non-limiting examples of silane-based crosslinking agents suitable for use in the insulator composition include the compounds represented by Formula 6, 7 and 8:

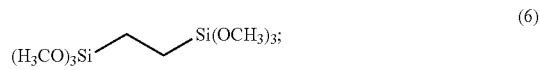

(6)

(7)

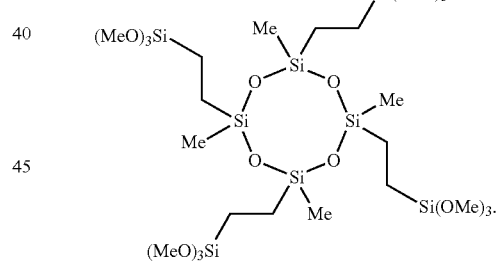

(8)

The acrylic organic crosslinking agent and the silane-based crosslinking agent may be used in a weight ratio of about 1:100 to about 100:1 and preferably in an equivalent ratio of 1:1.

The organic-inorganic hybrid material of the insulator composition may contain double or triple bonds as multiple bonds. That is, the organic-inorganic hybrid material may contain one or more alkenyl or alkynyl groups. Due to the absence of any heteroatom, for example oxygen or nitrogen, in the double or triple bonds of the organic-inorganic hybrid material, the insulator composition may be used to fabricate a thin film transistor that exhibits uniform properties without the occurrence of hysteresis.

The silane-based organic-inorganic hybrid material refers to an organic silane compound containing one or more multiple bonds or a polymer prepared by hydrolysis and condensation of at least one organic silane compound in the presence of an acid or base catalyst and water in an organic solvent. In an embodiment, the organic silane compound may be represented by Formula 9 or 10:

$$R_1SiX_1X_2X_3 \quad (9)$$

wherein $R_1$ may be a hydrogen atom, a $C_1$-$C_{10}$ alkyl group, a $C_3$-$C_{10}$ cycloalkyl group, a $C_6$-$C_{15}$ aryl group, a $C_2$-$C_{30}$ acryl group, an alkyl group substituted with one or more acryl groups, an alkyl or cycloalkyl group containing one or more epoxy groups, a vinyl group, an allyl group, or a $C_1$-$C_{10}$ alkoxy group, with the proviso that $R_1$ contains at least one group selected from vinyl, acetylene and acryl groups, and $X_1$, $X_2$ and $X_3$ are independently a halogen atom or a $C_1$-$C_{10}$ alkoxy group, with the proviso that at least one of $X_1$, $X_2$ and $X_3$ is a hydrolyzable group; or $$R_1R_2SiX_1X_2 \quad (10)$$

wherein $R_1$ and $R_2$ are independently a hydrogen atom, a $C_1$-$C_{10}$ alkyl group, a $C_3$-$C_{10}$ cycloalkyl group, a $C_6$-$C_{15}$ aryl group, a $C_2$-$C_{30}$ acryl group, an alkyl group substituted with one or more acryl groups, an alkyl or cycloalkyl group containing one or more epoxy groups, a vinyl group, an allyl group, or a $C_1$-$C_{10}$ alkoxy group, with the proviso that at least one of $R_1$ and $R_2$ contains at least one group selected from vinyl, acetylene and acryl groups, and $X_1$ and $X_2$ may be independently a halogen atom or a $C_1$-$C_{10}$ alkoxy group, with the proviso that at least one of $X_1$ and $X_2$ may be a hydrolyzable group.

In an alternative embodiment, the silane-based organic-inorganic hybrid material may be an organic-inorganic hybrid resin prepared by hydrolysis and condensation of at least one compound selected from the compounds of Formula 9 and 10 in the presence of an acid or base catalyst and water in an organic solvent. In another alternative embodiment, the silane-based organic-inorganic hybrid material may be a copolymer resin prepared by hydrolysis and condensation of at least one compound selected from the compounds of Formula 9 and 10 with a compound of Formula 11:

$$SiX_1X_2X_3X_4 \quad (11)$$

wherein $X_1$, $X_2$, $X_3$ and $X_4$ may be independently a halogen atom or a $C_1$-$C_{10}$ alkoxy group, with the proviso that at least one of $X_1$, $X_2$, $X_3$ and $X_4$ is a hydrolyzable group, in the presence of an acid or base catalyst and water in an organic solvent.

Examples of acid and base catalysts suitable for the preparation of the organic-inorganic hybrid resin may include hydrochloric acid, nitric acid, benzene sulfonic acid, oxalic acid, formic acid, potassium hydroxide, sodium hydroxide, triethylamine, sodium bicarbonate, pyridine, and mixtures thereof. The molar ratio of the monomer of Formula 9 or 10 or the monomers of Formula 9 and 10 to the catalyst may be in the range of about 1:0.000001 to about 1:10. The molar ratio of the monomer(s) to the water used for the hydrolysis and condensation may be in the range of about 1:1 to about 1:1,000.

The organic-inorganic hybrid material of the organic insulator composition may include a mixture of different silane-based organic-inorganic hybrid materials containing one or more alkenyl or alkynyl groups or a copolymer of different silane-based organic-inorganic hybrid materials containing one or more alkenyl groups. The organic-inorganic hybrid material may include a copolymer of a silane compound containing one or more double or triple bonds and a silane compound containing no double or triple bond. Each $R_1$ and $R_2$ in the copolymers may contain a hydrogen atom, a $C_1$-$C_{30}$ alkyl group, a $C_3$-$C_{30}$ cycloalkyl group, etc., in addition to multiple bonds.

Examples of suitable silane-based organic-inorganic hybrid materials may include, but are not necessarily limited to, the materials represented by Formula 12, 13 and 14:

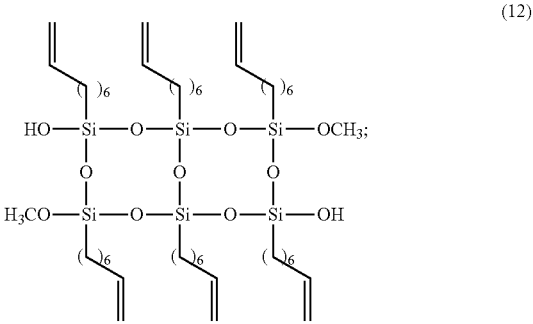

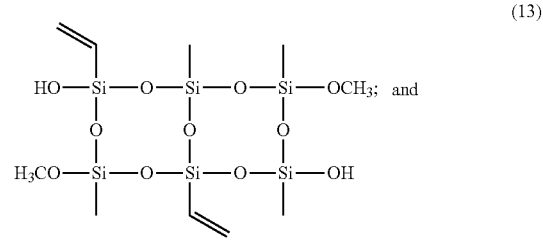

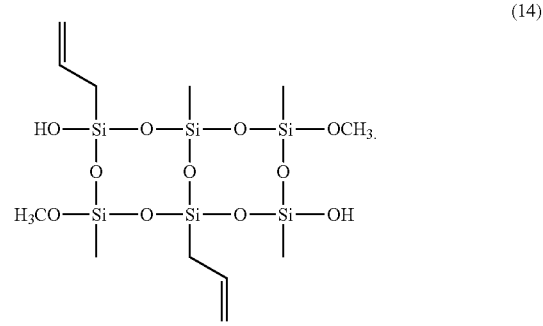

The molecular weight of the silane-based organic-inorganic hybrid material is in the range of about 100 to about 10,000, but is not particularly limited to this range.

In the case where the silane-based organic-inorganic hybrid material is a copolymer resin of a saturated hydrocarbon siloxane resin and an unsaturated hydrocarbon siloxane resin containing double bonds, the addition of a crosslinking assistant capable of crosslinking with the double bonds greatly increases the opportunity of crosslinking reactions due to the intermolecular condensation of the silanol moieties (Si—OH), as depicted in the following diagram:

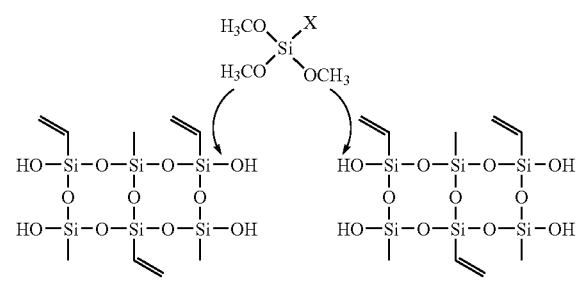

As a result, the frequency of crosslinking reactions between the silanol moieties of the resin molecules may be increased when the crosslinking assistant is used rather than when the inorganic crosslinking agent is not used, resulting in the formation of a rigid film.

Each of the acrylic organic crosslinking agent and the silane-based inorganic crosslinking agent may be used in an amount of about 1 to about 100 parts by weight, based on about 100 parts by weight of the silane-based organic-inorganic hybrid material. When the acrylic organic crosslinking agent or the silane-based inorganic crosslinking agent may be used in an amount greater than about 100 parts by weight, excessive crosslinking of the silane-based organic-inorganic hybrid material may be induced to form a gel in the solution. Meanwhile, when the crosslinking agent may be used in an amount of less than 1 part by weight, the crosslinking rate of the silane-based organic-inorganic hybrid material is too low to greatly contribute to the crosslinking of the silane-based organic-inorganic hybrid material.

The dielectric constant and leakage current of an organic insulator produced using the insulator composition may be optimized by varying the contents of the silane-based organic-inorganic hybrid material and the acrylic organic crosslinking agent and/or the silane-based inorganic crosslinking agent.

The insulator composition may further comprise a solvent capable of dissolving the silane-based organic-inorganic hybrid material, the acrylic organic crosslinking agent and the silane-based crosslinking agent.

Examples of solvents suitable for use in the insulator composition include aliphatic hydrocarbon solvents, such as hexane; aromatic hydrocarbon solvents, such as anisole, mesitylene and xylene; ketone-based solvents, such as isobutyl ketone, 1-methyl-2-pyrrolidinone and acetone; ether-based solvents, such as cyclohexanone, tetrahydrofuran and isopropyl ether; acetate-based solvents, such as ethyl acetate, butyl acetate and propylene glycol methyl ether acetate; alcohol-based solvents, such as isopropyl alcohols and butyl alcohol; amide-based solvents, such as dimethylacetamide and dimethylformamide; silicon-based solvents; and mixtures thereof.

When it is intended to coat the insulator composition on a substrate to form a film, the solvent may be used in an amount sufficient to adjust the final concentration of the solid components (i.e. the silane-based organic-inorganic hybrid material, the acrylic organic crosslinking agent, and the silane-based crosslinking agent) to a level required to apply the insulator composition on the substrate. The solvent may be present in an amount of about 100 to about 2,000 parts by weight, based on about 100 parts by weight of the silane-based organic-inorganic hybrid material. The use of the solvent in an amount of less than about 100 parts by weight fails to completely dissolve the solid components. Meanwhile, the use of the solvent in an amount exceeding about 2,000 parts by weight may cause the problem that a film as thin as about 1,000 Å is formed.

In accordance with another embodiment, there is provided an organic insulator comprising the organic insulator composition. The organic insulator composition uses the acrylic organic crosslinking agent capable of improving the crosslinking of multiple bonds and the inorganic crosslinking agent capable of being chemically bonded to the silanol moieties (Si—OH) of the siloxane resin. The use of a mixture of the two kinds of crosslinking assistants may be increase the frequency of crosslinking reactions with the siloxane resin, resulting in the formation of a rigid film. Since the organic insulator produced using the insulator composition may be highly rigid and dense, it may be stably maintained without any defect even when being exposed to a variety of chemicals and processing conditions in the subsequent steps, thus achieving improved processability.

The organic insulator may be formed by coating the insulator composition on a substrate and curing the coated composition. The coating of the insulator composition may be carried out by any known wet coating process. Examples of suitable coating processes may be include spin coating, dip coating, roll coating, screen coating, spray coating, spin casting, flow coating, screen printing, inkjet printing, and drop casting. In view of ease of coating and thickness uniformity, spin coating is most preferred. Upon spin coating, the spin speed may be adjusted within the range of about 400 to about 4,000 rpm. The curing may be carried out by heating the substrate to about 70-200° C. for about 0.5-2 hours. The curing conditions may vary depending on various factors, e.g., the kind of the organic insulating polymer and the composition of the organic insulating layer.

The organic insulator may be employed in a variety of electronic devices. For example, the organic insulator may be employed as an insulating layer of an organic thin film transistor.

In accordance with yet another embodiment, there may be provided an organic thin film transistor comprising a substrate, a gate electrode, a gate insulating layer, an organic semiconductor layer and source/drain electrodes wherein the gate insulating layer is the organic insulator.

The organic thin film transistor may be useful in various applications, such as driving devices of active organic electroluminescent displays and plastic chips for smart cards and inventory tags.

The thin film transistor may have any structure, for example, a top contact, bottom contact or top gate structure, but is not particularly limited to these structures. Exemplary structures of organic thin film transistors that may be fabricated using the organic insulator are schematically shown in FIGS. 1 and 2.

Figure 2:
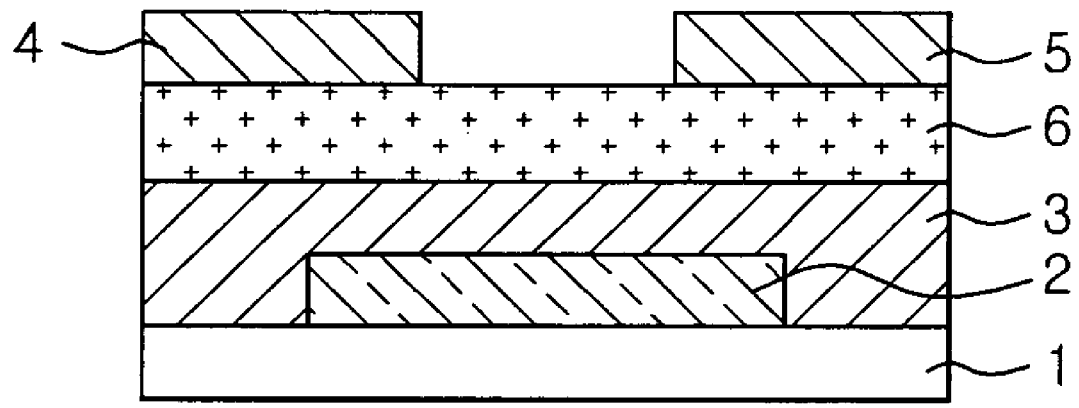
FIG. 2 is a schematic cross-sectional view of a top contact organic thin film transistor.

Specifically, FIG. 1 is a schematic cross-sectional view of a bottom contact organic thin film transistor, and FIG. 2 is a schematic cross-sectional view of a top contact organic thin film transistor.

For example, as shown in FIG. 1, the thin film transistor may have a structure in which a gate electrode 2, a gate insulating layer 3, source/drain electrodes 4 and 5 and an organic semiconductor layer 6 are formed in this order on a substrate 1. Alternatively, the thin film transistor may have a structure in which a gate electrode 2, a gate insulating layer 3, an organic semiconductor layer 6 and source/drain electrodes 4 and 5 are formed in this order on a substrate 1 (FIG. 2).

Materials for the substrate may be glass, silicon, polyethylene naphthalate (PEN), polyethylene terephthalate (PET), polycarbonate (PC), polyvinylbutyral, polyacrylate, polyimide, polynorbornene and polyethersulfone (PES), but are not necessarily limited thereto.

Any commonly known material may be used to form the organic semiconductor layer as an organic active layer. Specific non-limiting examples of materials for the organic active layer may be include pentacene, copper phthalocyanine, polythiophene, polyaniline, polyacetylene, polypyrrole, polyphenylene vinylene, and derivatives thereof.

The organic active layer of the organic thin film transistor may be formed by a wet process (e.g., printing coating, spin coating or bar coating) at ambient pressure, instead of conventional plasma-enhanced chemical vapor deposition (PECVD) for the formation of Si thin films. Furthermore, a roll-to-roll process using a plastic substrate may be applied to the formation of the organic active layer. Therefore, the thin film transistor may be fabricated at reduced cost.

The gate, source and drain electrodes may be made of metals that are commonly used in the art. Specific non-limiting examples of metals for these electrodes include gold (Au), silver (Ag), aluminum (Al), nickel (Ni), indium tin oxide (ITO), molybdenum (Mo) and tungsten (W).

A better understanding of exemplary embodiments will be described in more detail with reference to the following examples. However, these examples are given merely for the purpose of illustration and are not to be construed as limiting the scope of the embodiments.

EXAMPLES

Synthesis Example 1

Synthesis of Silane-Based Organic-Inorganic Hybrid Material Containing Multiple Bonds (MVTS)

Methyltrimethoxysilane (15 g, 110 mmol) and vinyltrimethoxysilane (16.3 g, 110 mmol) were placed in a flask, and then 1N HCl (0.66 mL) and 39.63 mL of water were slowly added thereto in a bath at about −30° C. The mixture was stirred at room temperature for about 24 hours and sufficiently washed with water. The organic layer was dried over MgSO$_4$ and filtered. The filtrate was distilled under reduced pressure to remove the solvent and dried under vacuum, yielding the compound (MVTS) of Formula 13:

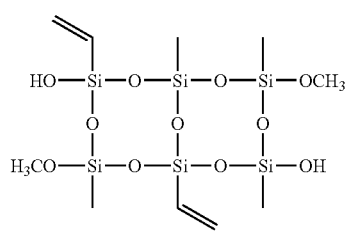

(13)

Figure 3:
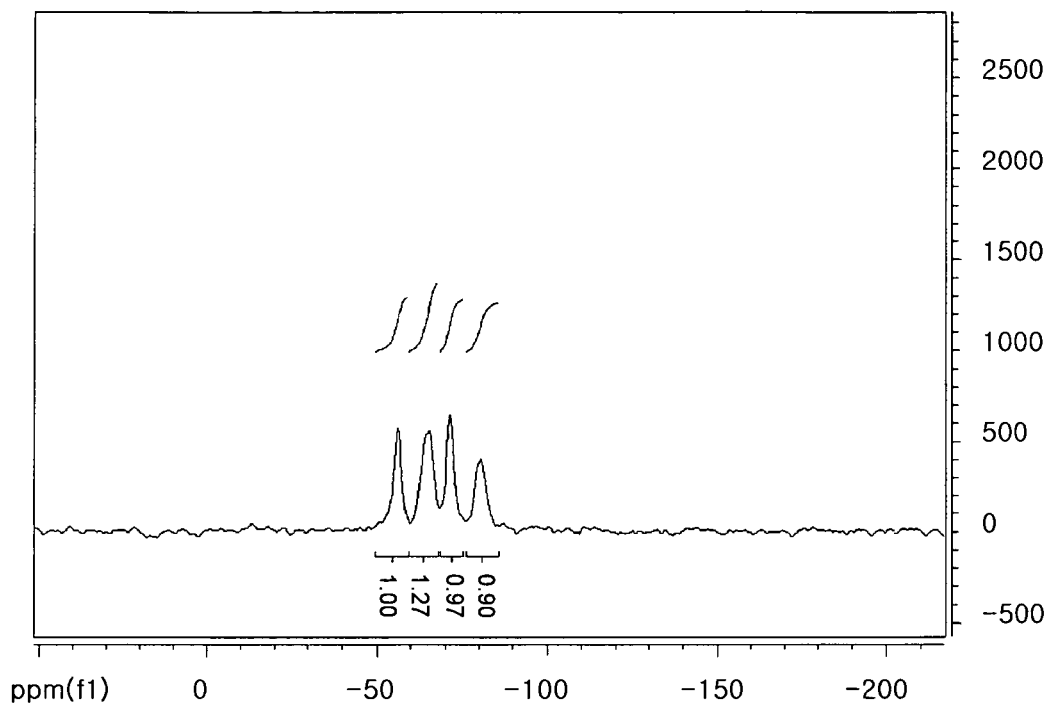
FIG. 3 is a Si NMR spectrum of an organic-inorganic hybrid material prepared in Synthesis Example 1.

The structure of the compound was identified by $^{29}$Si NMR (400 MHz) spectroscopy (FIG. 3).

Example 1

0.2 g of MVTS prepared in Synthesis Example 1 was sufficiently mixed with 0.04 g of di(trimethylolpropane)tetraacrylate (DPTA) and 0.02 g of TTPI (Formula 7) in 1 g of n-butanol to prepare an insulator composition.

Al/Nd was deposited to a thickness of about 1,000 Å on a clean glass substrate by sputtering to form a gate electrode. Subsequently, the insulator composition was spin-coated at about 1,500 rpm on the substrate and the gate electrode for about 50 seconds, pre-annealed at about 70° C. for about 2 minutes, irradiated with UV (about 500 mJ/cm$^2$), and baked at about 225° C. for one hour to form a about 600 nm-thick organic insulating layer.

A solution of polythiophene (1 wt %) in chlorobenzene was spin-coated at about 1,000 rpm on the organic insulating layer for about 30 seconds and annealed at about 500° C. for about 10 minutes to form an about 700 Å organic active layer composed of the polythiophene. At this time, the spin coating was conducted under a vacuum pressure of about 2×10$^{-6}$ torr at a substrate temperature of about 80° C. and a deposition rate of about 0.3 Å/sec.

Gold (Au) was deposited to a thickness of about 70 nm on the organic active layer by sputtering through a shadow mask (channel length: about 100 μm, channel width: about 1 mm) to form source/drain electrodes, completing the fabrication of an organic thin film transistor.

Comparative Example 1

An organic thin film transistor was fabricated in the same manner as in Example 1 except that MVTS only was used instead of the insulator composition.

Test Example 1

The characteristics of the organic thin film transistors fabricated in Example 1 and Comparative Example 1 were analyzed by Fourier transform infrared (FT-IR) spectroscopy. The results are shown in FIG. 4.

Figure 4:
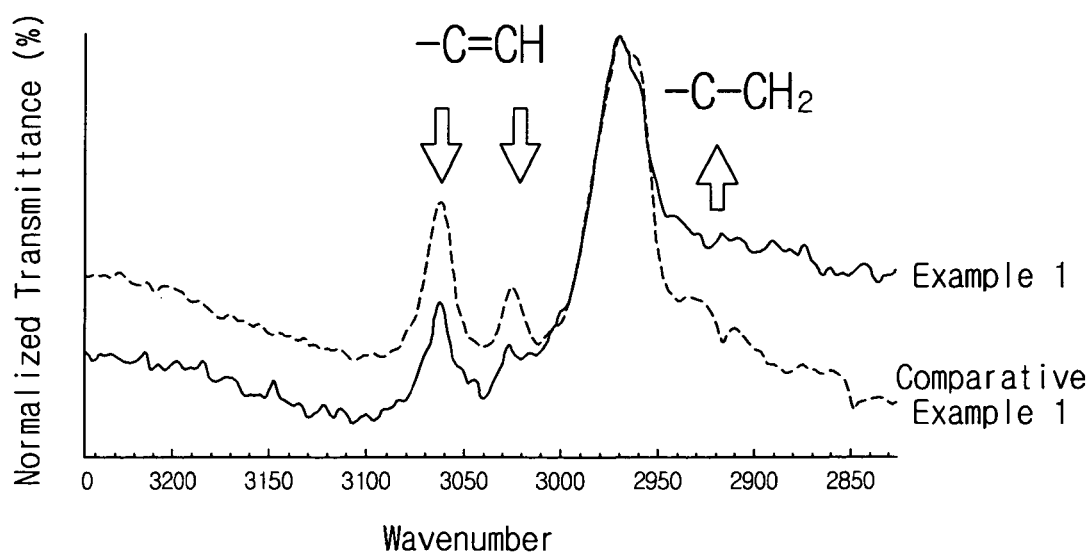
FIG. 4 is a graph showing the results of Fourier transform infrared (FT-IR) spectroscopy in Test Example 1 for devices fabricated in Example 1 and Comparative Example 1.

The graph of FIG. 4 shows that the combined use of the acrylic organic crosslinking agent and the silane-based inorganic crosslinking agent resulted in a distinct decrease in the number of double bonds (—C═CH) and a large increase in the number of single bonds (—C—CH$_2$) in the silane-based organic-inorganic hybrid material as compared to the use of no inorganic crosslinking agent.

While example embodiments have been described in detail with reference to its preferred embodiments, the embodiments are simply for the purpose of illustration. It will be understood by those skilled in the art that various modifications and their equivalents may be made without departing from the spirit and scope of the present invention. Thus, the genuine scope of the technical protection of the present invention should be defined by the spirit of the claims that follow.

What is claimed is:

1. A composition for producing an insulator, comprising
   a silane-based organic-inorganic hybrid material containing one or more multiple bonds,
   an acrylic organic crosslinking agent, and
   a silane-based crosslinking agent having six or more alkoxy groups, the silane-based crosslinking agent represented by Formula 4:

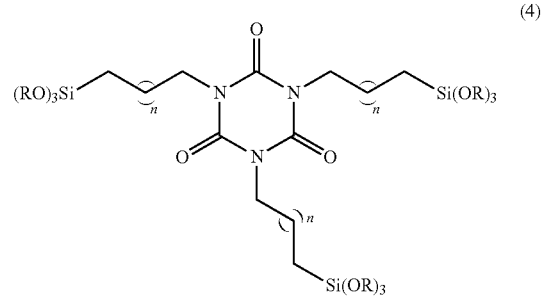

(4)

wherein each R is a C$_1$-C$_{10}$ alkyl group and n is from about 1 to about 10.

2. The composition of claim 1, wherein the acrylic organic crosslinking agent is represented by Formula 1:

(1)

wherein $R_3$, $R_4$, $R_5$ and $R_6$ are independently a hydrogen atom, a hydroxyl group, a $C_1$-$C_{10}$ alkyl group, a $C_3$-$C_{10}$ cycloalkyl group, a $C_6$-$C_{15}$ aryl group, a $C_2$-$C_{30}$ acryl group, an alkyl group substituted with one or more acryl groups, an alkyl group substituted with one or more hydroxyl groups, an alkyl or cycloalkyl group containing one or more epoxy groups, a vinyl group, an allyl group, or a $C_1$-$C_{10}$ alkoxy group.

3. The composition of claim 2, wherein the acrylic organic crosslinking agent is represented by Formula 2:

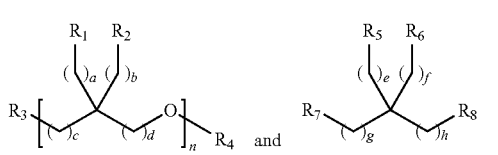

(2)

wherein $R_1$, $R_2$, $R_3$, $R_4$, $R_5$, $R_6$, $R_7$ and $R_8$ are independently a hydrogen atom, a hydroxyl group, a $C_1$-$C_{10}$ alkyl group, a $C_3$-$C_{10}$ cycloalkyl group, a $C_6$-$C_{15}$ aryl group, a $C_2$-$C_{30}$ alkyl or cycloalkyl group substituted with at least one group selected from acryloyl, acryloyloxy, epoxy and hydroxyl groups, a vinyl group, an allyl group, an acryloyloxy group, an epoxy group, or a $C_1$-$C_{10}$ alkoxy group, with the proviso that at least one of $R_1$ to $R_8$ contains an acryl group; a, b, c and d are zero or a natural number, the sum thereof being equal to or greater than 2; n is from about 1 to about 5, provided that when n is greater than 1, $R_1$ is identical to or different from $R_2$; and e, f, g and h is zero or a natural number, the sum thereof being equal to or greater than 2.

4. The composition of claim 1, wherein the silane-based crosslinking agent is represented by Formula 7:

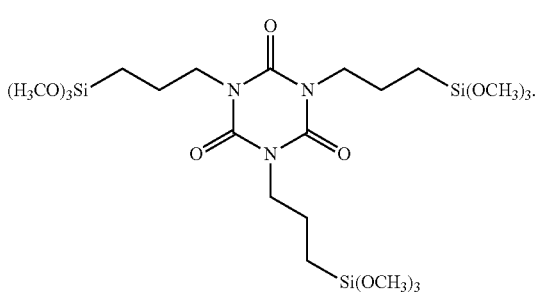

(7)

5. The composition of claim 1, wherein the silane-based organic-inorganic hybrid material is an organic silane compound of Formula 9 or 10:

$$R_1SiX_1X_2X_3 \qquad (9)$$

wherein $R_1$ is a hydrogen atom, a $C_1$-$C_{10}$ alkyl group, a $C_3$-$C_{10}$ cycloalkyl group, a $C_6$-$C_{15}$ aryl group, a $C_2$-$C_{30}$ acryl group, an alkyl group substituted with one or more acryl groups, a $C_2$-$C_{30}$ alkyl or cycloalkyl group containing one or more epoxy groups, a vinyl group, an allyl group, or a $C_1$-$C_{10}$ alkoxy group, with the proviso that $R_1$ contains at least one group selected from vinyl, acetylene and acryl groups, and $X_1$, $X_2$ and $X_3$ are independently a halogen atom or a $C_1$-$C_{10}$ alkoxy group, with the proviso that at least one of $X_1$, $X_2$ and $X_3$ is a hydrolyzable group; or $$R_1R_2SiX_1X_2 \qquad (10)$$

wherein $R_1$ and $R_2$ are independently a hydrogen atom, a $C_1$-$C_{10}$ alkyl group, a $C_3$-$C_{10}$ cycloalkyl group, a $C_6$-$C_{15}$ aryl group, a $C_2$-$C_{30}$ acryl group, an alkyl group substituted with one or more acryl groups, an alkyl or cycloalkyl group containing one or more epoxy groups, a vinyl group, an allyl group, or a $C_1$-$C_{10}$ alkoxy group, with the proviso that at least one of $R_1$ and $R_2$ contains at least one group selected from vinyl, acetylene and acryl groups, and $X_1$ and $X_2$ are independently a halogen atom or a $C_1$-$C_{10}$ alkoxy group, with the proviso that at least one of $X_1$ and $X_2$ is a hydrolyzable group;

a resin prepared by hydrolysis and condensation of at least one compound selected from the compounds of Formula 9 and 10 in the presence of an acid or base catalyst and water in an organic solvent; or a resin prepared by hydrolysis and condensation of at least one compound selected from the compounds of Formula 9 and 10 with a compound of Formula 11:

$$SiX_1X_2X_3X_4 \qquad (11)$$

wherein $X_1$, $X_2$, $X_3$ and $X_4$ are independently a halogen atom or a $C_1$-$C_{10}$ alkoxy group, with the proviso that at least one of $X_1$, $X_2$, $X_3$ and $X_4$ is a hydrolyzable group, in the presence of an acid or base catalyst and water in an organic solvent.

6. The composition of claim 5, wherein the silane-based organic-inorganic hybrid material is represented by Formula 12, 13 or 14:

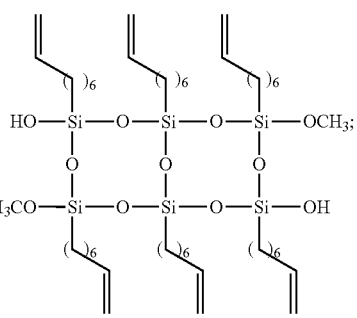

(12)

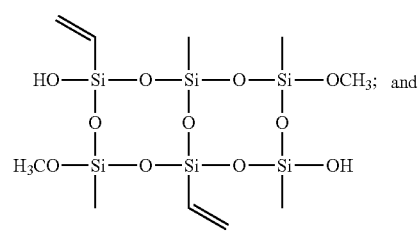

(13)

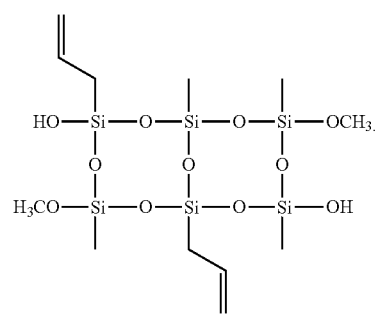

(14)

7. The composition of claim 1, wherein the composition comprises about 100 parts by weight of the silane-based organic-inorganic hybrid material, about 1 to about 100 parts by weight of the acrylic organic crosslinking agent and about 1 to about 100 parts by weight of the silane-based inorganic crosslinking agent.

8. The composition of claim 1, further comprising a solvent to dissolve the silane-based organic-inorganic hybrid material, the acrylic organic crosslinking agent and the silane-based crosslinking agent.

9. An organic insulator comprising the composition of claim 1.

10. An organic thin film transistor comprising a substrate, a gate electrode, an insulating layer, an organic semiconductor layer and source/drain electrodes wherein the insulating layer is the organic insulator of claim 9.

11. An electronic device comprising the organic thin film transistor of claim 10.

* * * * *